US012648207B2

(12) United States Patent
Park et al.

(10) Patent No.: US 12,648,207 B2
(45) Date of Patent: Jun. 2, 2026

(54) FIELD PLATE STRUCTURES FOR GaN HIGH VOLTAGE TRANSISTORS

(71) Applicant: Navitas Semiconductor Limited, Dublin (IE)

(72) Inventors: Pil Sung Park, Redondo Beach, CA (US); Daniel M. Kinzer, El Segundo, CA (US)

(73) Assignee: Navitas Semiconductor Limited, Dublin (IE)

( * ) Notice: Subject to any disclaimer, the term of this patent is extended or adjusted under 35 U.S.C. 154(b) by 656 days.

(21) Appl. No.: 17/829,905

(22) Filed: Jun. 1, 2022

(65) Prior Publication Data

US 2022/0384586 A1 Dec. 1, 2022

Related U.S. Application Data

(60) Provisional application No. 63/195,652, filed on Jun. 1, 2021.

(51) Int. Cl.
*H10D 64/00* (2025.01)
*H10D 30/47* (2025.01)
*H10D 62/85* (2025.01)

(52) U.S. Cl.
CPC ......... *H10D 64/111* (2025.01); *H10D 30/475* (2025.01); *H10D 62/8503* (2025.01)

(58) Field of Classification Search
CPC ... H01L 29/402; H01L 29/404; H10D 64/111; H10D 30/475
See application file for complete search history.

(56) References Cited

U.S. PATENT DOCUMENTS

| | | | |
|---|---|---|---|
| 2016/0343833 A1 | 11/2016 | Huang et al. | |
| 2017/0352754 A1* | 12/2017 | Beach | H10D 62/824 |
| 2018/0331186 A1* | 11/2018 | Srivastava | H10D 64/117 |
| 2020/0052103 A1* | 2/2020 | Tao | H01L 29/402 |
| 2021/0111254 A1 | 4/2021 | Evan | |

(Continued)

FOREIGN PATENT DOCUMENTS

| CN | 106298882 | 1/2017 |
|---|---|---|
| CN | 109196650 | 1/2019 |
| CN | 110391297 | 10/2019 |

(Continued)

OTHER PUBLICATIONS

TW111120449 , "Office Action", Feb. 17, 2023, 9 pages.
Chinese Office Action (including English translation) issued in CN202210639872, dated Apr. 23, 2025, 1-20 pages.

*Primary Examiner* — Michele Fan
(74) *Attorney, Agent, or Firm* — FisherBroyles, LLP

(57) ABSTRACT

Field plate structures for gallium nitride (GaN) high voltage transistors are disclosed. In one aspect, a transistor includes a GaN substrate, a source region formed on the GaN substrate, a drain region formed on the GaN substrate and separate from the source region, a gate region formed between the source region and the drain region, a pedestal formed on the GaN substrate and positioned between the gate region and the drain region, and a field plate electrically coupled to the source region, where the field plate extends from a proximal region positioned between the source region and the pedestal, towards the drain region, where at least a portion of the field plate overlaps at least a portion of the pedestal.

13 Claims, 9 Drawing Sheets

(56)                   References Cited

U.S. PATENT DOCUMENTS

2023/0187529 A1 *    6/2023   Kawashima ...... H01L 29/41725
                                              257/183

FOREIGN PATENT DOCUMENTS

| | | |
|---|---|---|
| CN | 112585762 | 3/2021 |
| CN | 115552631 | 12/2022 |
| JP | 2011210752 A * | 10/2011 |
| TW | 202005086 A | 1/2020 |
| TW | 202105529 A | 2/2021 |

* cited by examiner

FIELD PLATE STRUCTURES FOR GaN HIGH VOLTAGE TRANSISTORS

CROSS REFERENCE TO RELATED APPLICATIONS

This application claims priority to U.S. provisional patent application Ser. No. 63/195,652, for "Field Plate Structures for GaN High Voltage Transistors" filed on Jun. 1, 2021 which is hereby incorporated by reference in entirety for all purposes.

FIELD

The described embodiments relate generally to high voltage transistors, and more particularly, the present embodiments relate to field plate structures for gallium nitride (GaN) high voltage transistors.

BACKGROUND

In semiconductor technology, gallium nitride (GaN) is one compound semiconductor material that is used to form various devices, such as high power and/or high voltage transistors. These devices can be formed by growing epitaxial layers on silicon, silicon carbide, sapphire, gallium nitride, or other substrates. Often, such devices are formed using a heteroepitaxial junction of aluminum gallium nitride (AlGaN) and GaN. This structure is known to form a high electron mobility two-dimensional electron gas (2DEG) at the interface of the two materials. High voltage GaN transistors may utilize field plates to increase their operating voltage. In many applications, it may be desirable to control an intensity of the electric field in the high voltage transistor.

SUMMARY

In some embodiments, a transistor is disclosed. The transistor includes a gallium nitride (GaN) substrate, a source region formed on the GaN substrate, a drain region formed on the GaN substrate and separate from the source region, a gate region formed between the source region and the drain region, a pedestal formed on the GaN substrate and positioned between the gate region and the drain region, and a field plate electrically coupled to the source region, where the field plate extends from a proximal region positioned between the source region and the pedestal, towards the drain region, where at least a portion of the field plate overlaps at least a portion of the pedestal.

In some embodiments, the transistor also includes a dielectric layer extending across at least a portion of the GaN substrate and across at least a portion of the pedestal, where the dielectric layer is positioned between the pedestal and the field plate.

In some embodiments, the proximal region of the field plate is separated from the GaN substrate by a thickness of the dielectric layer, and a distal region of the field plate is separated from the GaN substrate by the thickness of the dielectric layer and a thickness of the pedestal.

In some embodiments, a ratio of a distance between the distal region of the field plate and the GaN substrate to a distance between the proximal region of the field plate and the GaN substrate is between 1.05 and 10.0.

In some embodiments, the pedestal is a first pedestal of a plurality of pedestals.

In some embodiments, each pedestal of the plurality of pedestals is formed in shape of an island.

In some embodiments, the pedestal is formed from a P-type GaN layer.

In some embodiments, the pedestal is formed from a dielectric layer.

In some embodiments, the dielectric layer includes silicon nitride.

In some embodiments, a portion of the field plate is formed at an angle with respect to the GaN substrate.

In some embodiments, a value of the angle is determined by a ratio of a distance between a distal region of the field plate and the GaN substrate to a distance between the proximal region of the field plate and the GaN substrate.

In some embodiments, a value of the angle is between 5 to 175 degrees.

In some embodiments, a transistor is disclosed. The transistor includes a substrate, a source region formed on the substrate, a drain region formed on the substrate and separate from the source region, a gate region formed between the source region and the drain region, a pedestal formed on the substrate and positioned between the gate region and the drain region, a field plate electrically coupled to the source region, the field plate extending towards the drain region, across a portion of the substrate and across at least a portion of the pedestal, and a dielectric layer extending across at least a portion of the substrate and extending across at least a portion of the pedestal, the dielectric layer being positioned between the pedestal and the field plate.

In some embodiments, a proximal region of the field plate is separated from the substrate by a thickness of the dielectric layer and wherein a distal region of the field plate is separated from the substrate by the thickness of the dielectric layer and a thickness of the pedestal.

In some embodiments, a ratio of a distance between the distal region of the field plate and the substrate to a distance between the proximal region of the field plate and the substrate is between 1.02 and 10.0.

In some embodiments, the transistor further includes two or more pedestals.

In some embodiments, the pedestals are formed in shape of islands.

In some embodiments, a portion of the field plate is formed in shape of an angle with respect to the GaN substrate.

In some embodiments, a value of the angle is determined by a ratio of a distance between a distal region of the field plate and the substrate to a distance between a proximal region of the field plate and the substrate.

In some embodiments, a value of the angle is between 5 to 175 degrees.

DETAILED DESCRIPTION

Structures and related techniques disclosed herein relate generally to lateral transistors. More specifically, devices, structures and related techniques disclosed herein relate to gallium nitride (GaN) high voltage lateral transistors where field plate structures can be utilized to reduce peak electric fields, resulting in improved reliability of the transistors. In lateral high voltage transistors, it is beneficial to reduce electric fields especially at field plate edges. A reduced electric field can allow for use of relatively smaller high voltage lateral transistors, thereby reducing die size and saving system costs. Furthermore, a reduced electric field can improve reliability of the lateral high voltage transistor and extend operational life of the high voltage transistor. Embodiments of the disclosure can enable customizing a structure of the field plate such that the field plate's distance to a substrate can be increased, thereby reducing the electric field within the substrate.

In some embodiments, various layers can be formed in shape of a pedestal, and positioned under a field plate edge in order increase the distance between the field plate to the substrate, thereby reducing the electric field in the substrate. These layers can include, but not limited to, GaN layers, such as P-type GaN layers, or any suitable dielectric such as silicon nitride or silicon oxide, or any other suitable material. In various embodiments, the customized field plate structures can enable a reduction in size of a GaN high voltage transistor and/or enable relatively higher operating voltage of a GaN high voltage transistor in the same die area. Various inventive embodiments are described herein, including methods, processes, systems, devices, and the like.

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

Figures 1A, 1B:
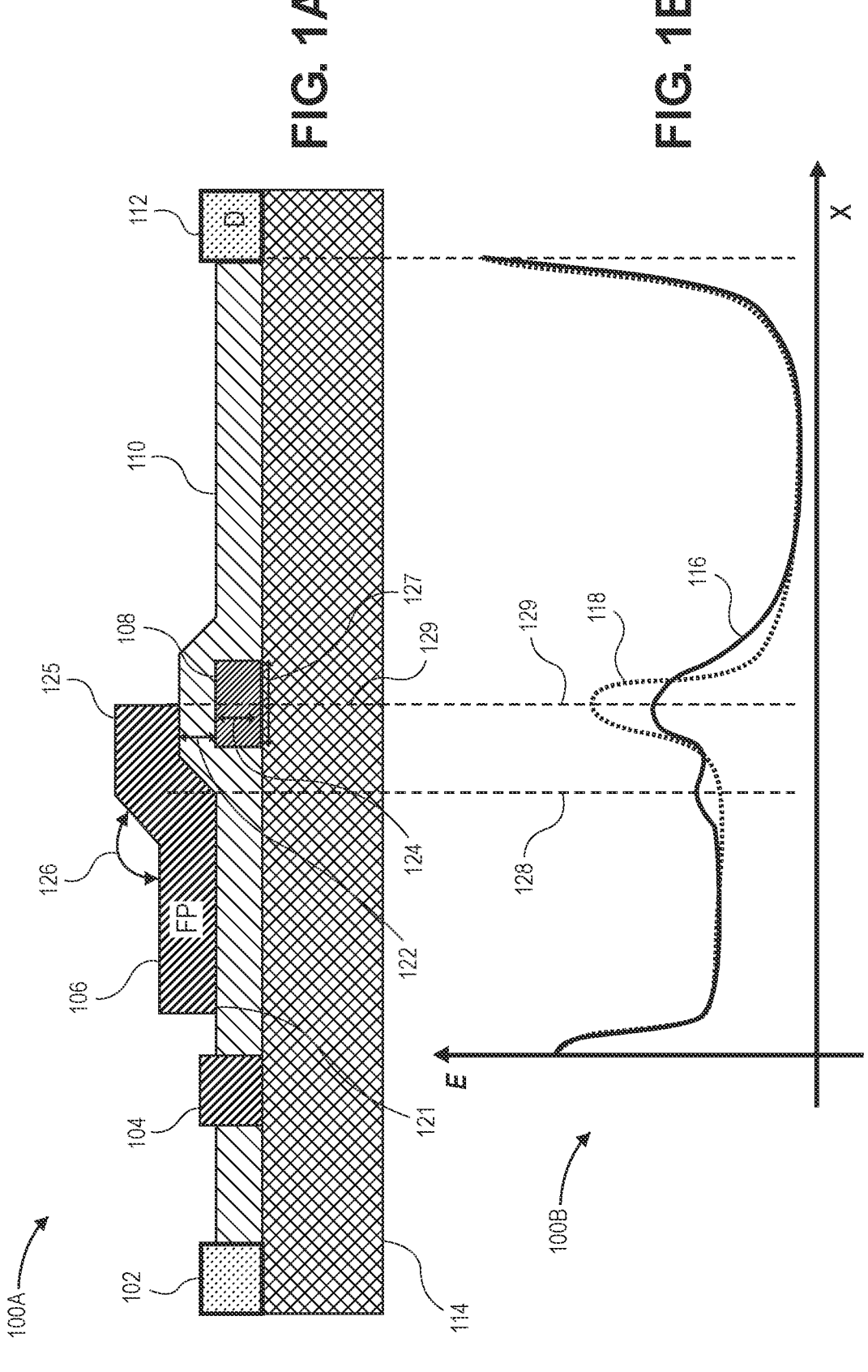
FIG. 1A illustrates a cross-sectional view of a GaN transistor with field plate structures having a pedestal according to an embodiment of the disclosure.
FIG. 1B is a graph showing electric field as a function of distance from gate to drain of the GaN transistor of FIG. 1A.

FIG. 1A illustrates a cross-sectional view of a GaN transistor 100A with field plate structures according to an embodiment of the disclosure. FIG. 1B shows a graph 100B illustrating an electric field within transistor 100A as a function of distance from gate region 104 to drain 112. As shown in FIG. 1A, GaN transistor 100A can include a source region 102, a gate region 104 and a drain region 112. The source region 102 and drain region 112 can be electrical contact regions, for example (but not limited to) regions where metallic terminals are formed. FIG. 1B shows a graph 100B illustrating the electric field within transistor 100A as a function of distance from gate region 104 to drain 112. As shown in FIG. 1B, first electric field 116 includes pedestal 108 and exhibits a much lower peak at the distal region 129 of the field plate 106 as compared to second electric field 118 for a transistor without a pedestal.

In some embodiments, gate region 104 can be an electrode formed across a P-type GaN layer and can be in ohmic contact with the P-type GaN layer. In various embodiments, the gate region can be formed from a P-type GaN layer in schottky contact with a substrate. In some embodiments, a direct schottky gate can be used to form the gate region. The gate region 104 can be formed between the source region 102 and the drain region 112. The transistor structure can be fabricated on a substrate 114. In some embodiments, transistor 100A can be formed on a substrate that may include gallium nitride, gallium nitride on silicon, silicon carbide, gallium arsenide, indium phosphide or any other suitable semiconductor material.

In some embodiments, the transistor 100A can include a GaN-based substrate 114, a source region 102 formed on the substrate, a drain region 112 formed on the substrate and separate from the source region, a gate region 104 formed between the source region and the drain region, a pedestal 108 formed on the substrate and positioned between the gate region and the drain region, and a field plate 106 electrically coupled to the source region, the field plate extending from a proximal region positioned between the source region and the pedestal, towards the drain region, where at least a portion of the field plate overlaps at least a portion of the pedestal.

In various embodiments, a substrate can include a first layer that can include silicon, silicon carbide, sapphire, aluminum nitride or other material. A second layer can be disposed on the first layer and can include gallium nitride or other material. A third layer may be disposed on second layer and can include a composite stack of other III nitrides such as, but not limited to, aluminum nitride, indium nitride and III nitride alloys such as aluminum gallium nitride and indium gallium nitride. In some embodiments, third layer can be $Al_{0.20}\,Ga_{0.80}$ N. In various embodiments, a two-dimensional electron gas (2DEG) can be formed at the interface of second layer and the third layer. In some embodiments, the third layer may include a thin boundary layer with high Al content and a relatively thick layer with less Al content. In various embodiments the third layer can have a GaN cap layer while in other embodiments the third layer may not have a GaN cap layer.

In some embodiments, the GaN transistor 100A can be a relatively high voltage lateral transistor which can include a field plate 106. For example, the GaN transistor 100A may have operational voltage of 600 V or higher. In some embodiments, the GaN transistor 100A may have operational voltage of 5 V to 100 V, while in other embodiments the GaN transistor 100A may have operational voltage of 150 V to 800 V. The field plate 106 can be positioned between the gate region 104 and the drain region 112. In some embodiments, a dielectric layer 110 can be positioned between the field plate 106 and substrate 114. Dielectric layer 110 may be formed from silicon nitride (SiN), silicon oxide ($SiO_2$), or other suitable material. In various embodiments, a pedestal structure 108 can be added to the transistor 100A under a distal region 129 of the field plate, where a proximal region 121 of the field plate 106 is electrically coupled to the source region 102. The field plate 106 can extend across at least a portion of the pedestal 108. In some embodiments, the field plate 106 can extend all the way across the pedestal 108. In various embodiments, the field plate can extend up to 75% across, while in other embodiments it can extend up to 50% across, while in other embodiments it can extend less than 50% across the pedestal 108.

The proximal region 121 of the field plate 106 can be separated from the substrate 114 by a thickness of the dielectric layer 122 and the distal region 129 of the field plate can be separated from the substrate by the thickness of the dielectric layer 122 and a thickness 124 of the pedestal 108. Thus, a portion of the field plate 106 starting at location 128 can be slanted with an angle 126 such that a distance between field plate 106 and the substrate 114 increases in a direction of a distal region 125 of the field plate. The increase in the separation between the field plate 106 and the substrate 114 in the distal region 125 can cause a reduction of electric field (e.g., see electric field at distal region 129 in FIG. 1B). A width 127 of the pedestal 108 can be, for example, between 1.0 um to 2.0 um. In some embodiments a width 127 of pedestal can be between 0.6 um and 0.8 um while in other embodiments the width can be between 0.5 um and 1.0 um and in various embodiments the width can be between 0.1 um and 5.0 um. A thickness 124 of the pedestal 108 can be, for example, between 50 nm and 100 nm. In some embodiments, the thickness 124 can between 60 nm and 80 nm while in other embodiments the thickness can be between 30 nm and 200 nm and in various embodiments the thickness can be between 10 and 500 nm. In some embodiments, a ratio of a distance between the distal region 129 of the field plate 106 and the substrate 114 to a distance between the proximal region 121 of the field plate and the substrate can be between 1.1 and 3.0, while in other embodiments the ratio can be between 1.05 and 5.0 and in various embodiments the ratio can be between 1.01 and 10.0. As appreciated by one of ordinary skill in the art having the benefit of this disclosure, the width and thickness of the pedestal, and the ratio of a distance between the distal region of the field plate and the substrate to a distance between the proximal region of the field plate and the substrate can be set to any suitable value. Further, as appreciated by one of ordinary skill in the art, disclosed field plate structures can have one or more pedestals, different sized pedestals and other characteristics that can be different than those described here. Moreover, as appreciated by one of ordinary skill in the art, the dielectric layer can be constructed from one or more dielectric layers.

The pedestal 108 can cause the field plate 106 to form an angled shape from proximal region 121 to distal region 125. In some embodiments, the angle 126 between proximal region 121 and distal region 125 can have a value between, for example, 20 to 60 degrees, while in other embodiments the value of the angle can be between 10 to 70 degrees and in various embodiments the value can be between 5 degrees to 85 degrees. As appreciated by one of ordinary skill in the art having the benefit of this disclosure, the value for the angle 126 can be set to any suitable value by setting a value of thickness 124 for the pedestal 108.

The reduction in the peak of second electric field 118 can improve characteristics of the GaN transistor 100A such as increased reliability, increased operating voltage, and/or reduction in transistor size. In some embodiments, the reduction in second electric field 118 can be caused by an increased separation between the distal region 125 of the field plate 106 and the substrate 114. In various embodiments, a thickness of the dielectric 110 under the field plate 106 may be increased in the distal region compared to the proximal region 121 by varying a fabrication process of the transistor 100A. At location 128, a value of the first electric field 116 may have a small increase relative to second electric field 118 due to the buildup in the peak electrical field at an end region of the field plate that is near substrate 114, however, because the electric field is also spread along distal region 125 the overall peak of first electric field is reduced with the addition of pedestal 108.

As described above, the use of a field plate 106 with a pedestal 108 can result in a reduction of the electric field resulting in improved performance of the transistor over time, improved reliability and/or a reduction in size of the transistor. In some embodiments, field plate structure 106 with a pedestal 108 can enable higher operating voltage of the transistor in the same area as that of a transistor without a pedestal. In various embodiments the pedestal 108 can be formed from, for example (but not limited to) P-type gallium nitride, from any suitable dielectric such as silicon nitride or silicon oxide, or from any other suitable material. In various embodiments, the pedestal 108 can be formed from, for example, suitable semiconductor or dielectric or non-conductive materials.

In some embodiments, a value of the angle 126 can contribute to peak electric field distribution along the active region. A relatively smaller angle can decrease a first peak electric field at location 128 and increase a second peak electric field at distal region 129. A relatively larger angle, can increase the first peak electric field at location 128 and decrease the second peak electric field at distal region 129. For all angle values, the highest electric field is lower than the electric field of a transistor without a pedestal. The value of the angle 126 can be determined by conformal deposition of dielectric layers and by thickness of pedestal layer and the thickness of following dielectric layer.

Figures 2, 3A:
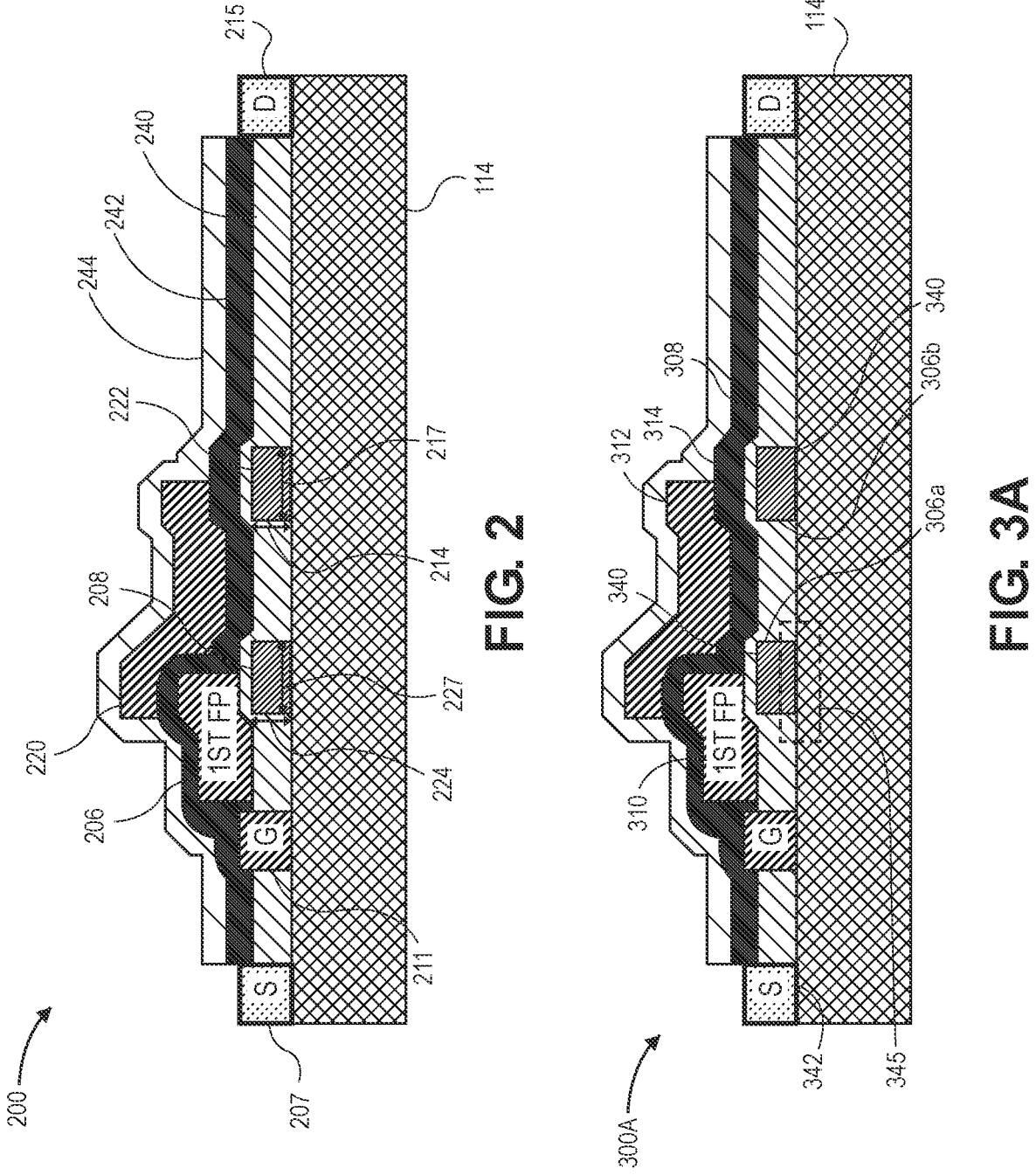
FIG. 2 illustrates a cross-sectional view of a GaN transistor with field plate structures according to an embodiment of the disclosure.
FIG. 3A illustrates a cross-sectional view of a GaN transistor with field plate structures using dielectric layers according to an embodiment of the disclosure.

FIG. 2 illustrates a cross-sectional view of a GaN transistor 200 with field plate structures according to an embodiment of the disclosure. GaN transistor 200 is similar to GaN transistor 100A, however GaN transistor 200 may have multiple filed plates. In this embodiment, GaN transistor 200 can include a first field plate 206 shaped by pedestal 208 and can include a second field plate 220 shaped by a corresponding pedestal 222. As appreciated by one of ordinary skill in the art having the benefit of this disclosure, transistor 200 may have a third filed plate (not shown) or a fourth filed plate (not shown) or up to an $n^{th}$ filed plate with corresponding pedestal structures (not shown). In some embodiments, the first field plate 206 can be electrically coupled to gate 211, whereas the second field plate 220 can be electrically coupled to the source 207 of the transistor 200. First field plate 206 can be connected to the gate 211 to reduce a capacitance between gate 211 and drain 215. In various embodiments, multiple pedestals can be added to multiple field plate structures in the disclosed lateral high voltage GaN transistors to reduce the electric field resulting in increased reliability, increased operating voltage, and/or reduction in transistor size, as described above. GaN transistor 200 can further include a dielectric layer 240 disposed on the pedestals 208 and 222, a dielectric layer 242 disposed on the first plate 206 and a dielectric layer 244 disposed on the second filed plate 220.

In some embodiments, pedestals (208 and 222) can be fabricated from, for example (but not limited to) P-type gallium nitride, or from dielectrics such as silicon nitride or silicon oxide, or from any other suitable material. In various embodiments, the pedestals (208 and 222) can be formed, for example, from conductive or non-conductive materials. Width 227 of the pedestal 208 can range between, for example, 1.0 um to 2.0 um. In some embodiments the width of pedestal can be between 0.6 and 0.8 um while in other embodiments the width can be between 0.5 and 1.0 um and in various embodiments the width can be between 0.1 and 5.0 um. Thickness 224 of the pedestal can be, for example, 50 nm to 100 nm. In some embodiments, the thickness can between 60 and 80 nm while in other embodiments the thickness can be between 30 and 200 nm and in various embodiments the thickness can be between 10 and 500 nm. As appreciated by one of ordinary skill in the art having the benefit of this disclosure, the width and thickness of the pedestal can be set to any suitable value. Further, as appreciated by one of ordinary skill in the art, disclosed field plate structures can have fewer or greater number of pedestals, different sizes for pedestals and other characteristics that can be deferred than those described here. Width 217 of the pedestal 222 can range between, for example, 1.0 um to 2.0 um. In some embodiments the width of pedestal can be between 0.6 and 0.8 um while in other embodiments the width can be between 0.5 and 1.0 um and in various embodiments the width can be between 0.1 and 5.0 um. Thickness 214 of the pedestal can be, for example, 50 nm to 100 nm. In some embodiments, the thickness can between 60 and 80 nm while in other embodiments the thickness can be between 30 and 200 nm and in various embodiments the thickness can be between 10 and 500 nm. As appreciated by one of ordinary skill in the art having the benefit of this disclosure, the width and thickness of the pedestal can be set to any suitable value. Further, as appreciated by one of ordinary skill in the art, disclosed field plate structures can have fewer or greater number of pedestals, different sizes for pedestals and other characteristics that can be deferred than those described here.

FIG. 3A illustrates a cross-section of a GaN transistor 300A that is similar to transistor 100A illustrated in FIG. 1A, however transistor 300A has multiple pedestals formed at a first dielectric layer 340, according to an embodiment of the disclosure. As shown in FIG. 3A, the transistor 300A can include multiple pedestals 306a, 306b positioned between the gate and the drain of the transistor that are formed from a first dielectric layer 340. A second dielectric layer 308 can be positioned on top of the pedestals and a first field plate 310 can be disposed on top of the second dielectric layer. A third dielectric layer 314 can be positioned on top of the second dielectric layer and a second field plate 312 can be disposed on top of the second dielectric layer. The second filed plate can be electrically coupled to source 342. In some embodiments, multiple field plates can be utilized to fine tune an electric field in a drift region 345 of the GaN transistor as shown in FIG. 1B. In various embodiments, the pedestals can be formed from dielectrics such as silicon nitride or silicon oxide, or from any other suitable material.

Figures 3B, 3C:
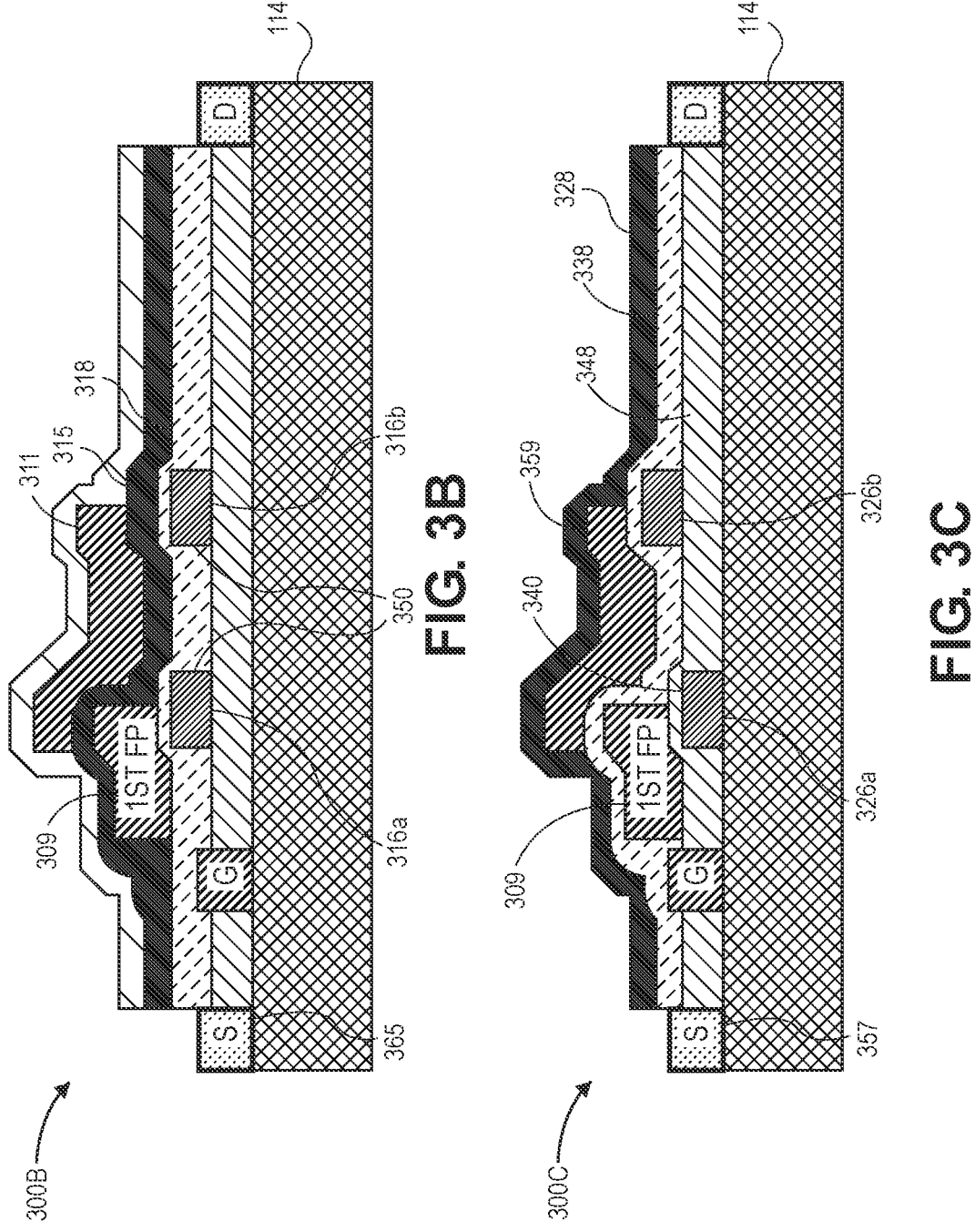
FIG. 3B illustrates a cross-sectional view of a GaN transistor with field plate structures using dielectric layers according to an embodiment of the disclosure.
FIG. 3C illustrates a cross-sectional view of a GaN transistor with field plate structures using dielectric layers according to an embodiment of the disclosure.

FIG. 3B illustrates a cross-section of a GaN transistor 300B that is similar to transistor 100A illustrated in FIG. 1A, however transistor 300B has multiple pedestals formed at a second dielectric layer 350, according to an embodiment of the disclosure. As shown in FIG. 3B, the transistor can include multiple pedestals 316a and 316b positioned between the gate and the drain of the transistor that can be formed from a second dielectric layer 350. In the transistor 300B, a third dielectric layer 318 can be positioned on the pedestals 316a and 316b, and on a first field plate 309. A fourth dielectric layer 315 can be positioned on the third dielectric layer 318 and on a second field plate 311. In various embodiments, multiple field plates can be utilized to fine tune an electric field in a drift region of the GaN transistor as shown in FIG. 1B. The multiple field plates can be electrically coupled to source 355. In some embodiments, the pedestals can be formed from dielectrics such as silicon nitride or silicon oxide, or from any other suitable material. In various embodiments, the pedestals may be forms from conductive or non-conductive materials. In some embodiments, the pedestals may be formed from GaN and/or AlGaN.

FIG. 3C illustrates a cross-section of a GaN transistor 300C that is similar to transistor 300B, however transistor 300C can have multiple pedestals that can be formed at a various dielectric layers, according to an embodiment of the disclosure. As shown in FIG. 3C, transistor 300C can include multiple pedestals 326a, 326b positioned between the gate and the drain that can be formed at any dielectric layer. For example, pedestal 326a may be formed at dielectric layer 340, while pedestal 326b may be formed at dielectric layer 358. As appreciated by one of skilled in the art having the benefit of this disclosure, this technique can be extended at any dielectric layer and various other dielectric layers up to an $n^{th}$ layer. An $n^{th}$ dielectric layer 328 can be positioned on the pedestals and on the $n^{th}$ field plate 359. The $n^{th}$ field plate and/or multiple filed plates can be electrically coupled to source 357. Transistor 300C can include dielectric layers 338 and 348. In some embodiments, multiple field plates can be utilized to fine tune an electric in a drift region of the GaN transistor as shown in FIG. 1B. In various embodiments, the pedestals can be formed from dielectrics such as silicon nitride or silicon oxide, or from any other suitable material.

Figure 4:
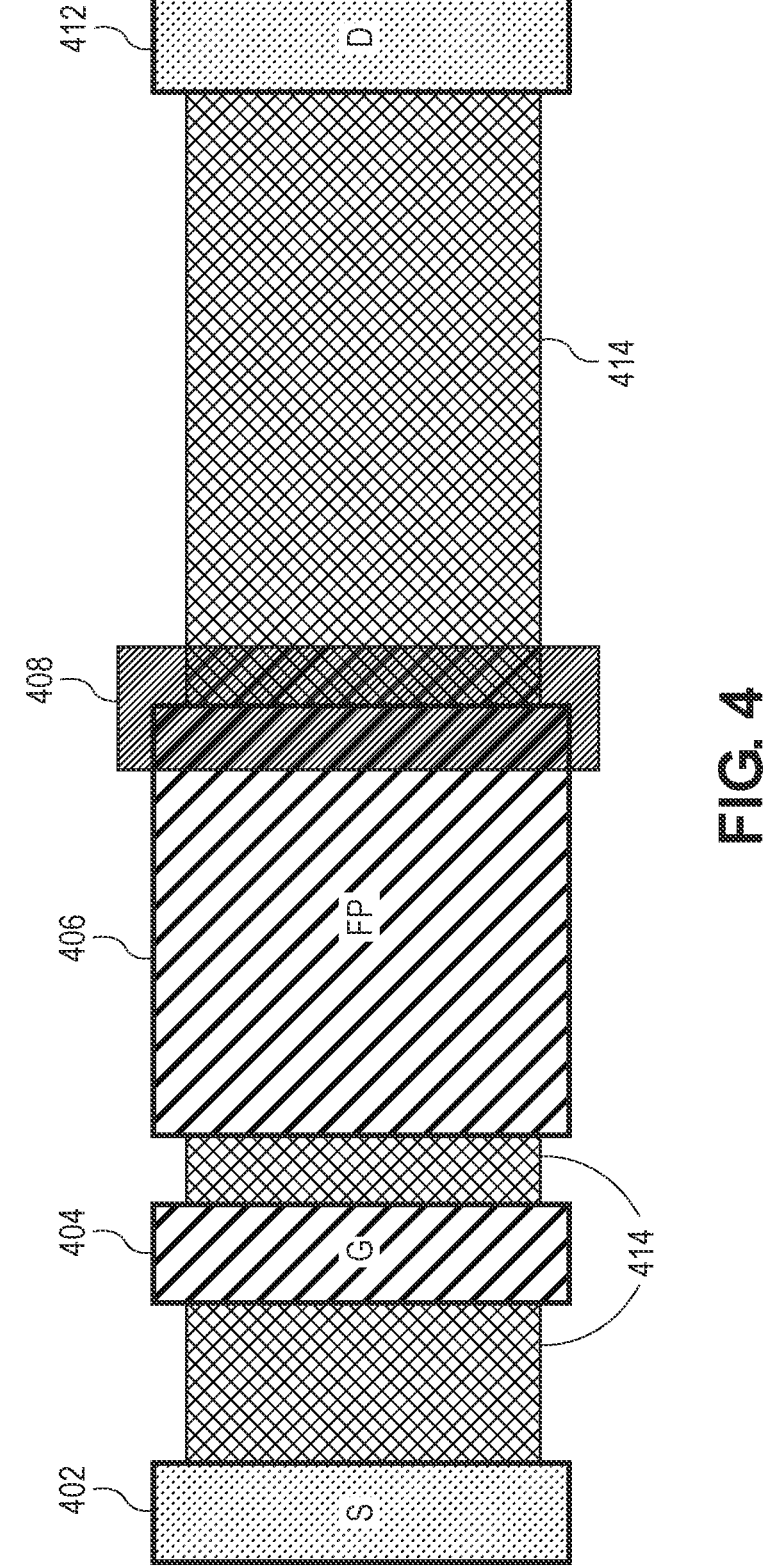
FIG. 4 illustrates a plan view of a GaN transistor according to an embodiment of the disclosure.

FIG. 4 illustrates a plan view of GaN transistor 400 that is similar to transistor 100A illustrated in FIG. 1 according to an embodiment of the disclosure. Transistor 400 can include a substrate 414, a source region 402, a gate region 404, and a drain region 412. Transistor 400 can further include a field plate 406 and a pedestal 408. The pedestal can have a shape of a rectangle and can be positioned at the edge of the field plate. The use of the pedestal can reduce the electric field and improve the transistor performance as discussed in detail above in FIG. 1A. In various embodiments, pedestal 408 can be formed from, for example (but not limited to) P-type gallium nitride, or from dielectrics such as silicon nitride or silicon oxide, or from any other suitable material. In various embodiments, the pedestal can be formed from, for example, conductive or non-conductive materials.

Figures 5A, 5B:
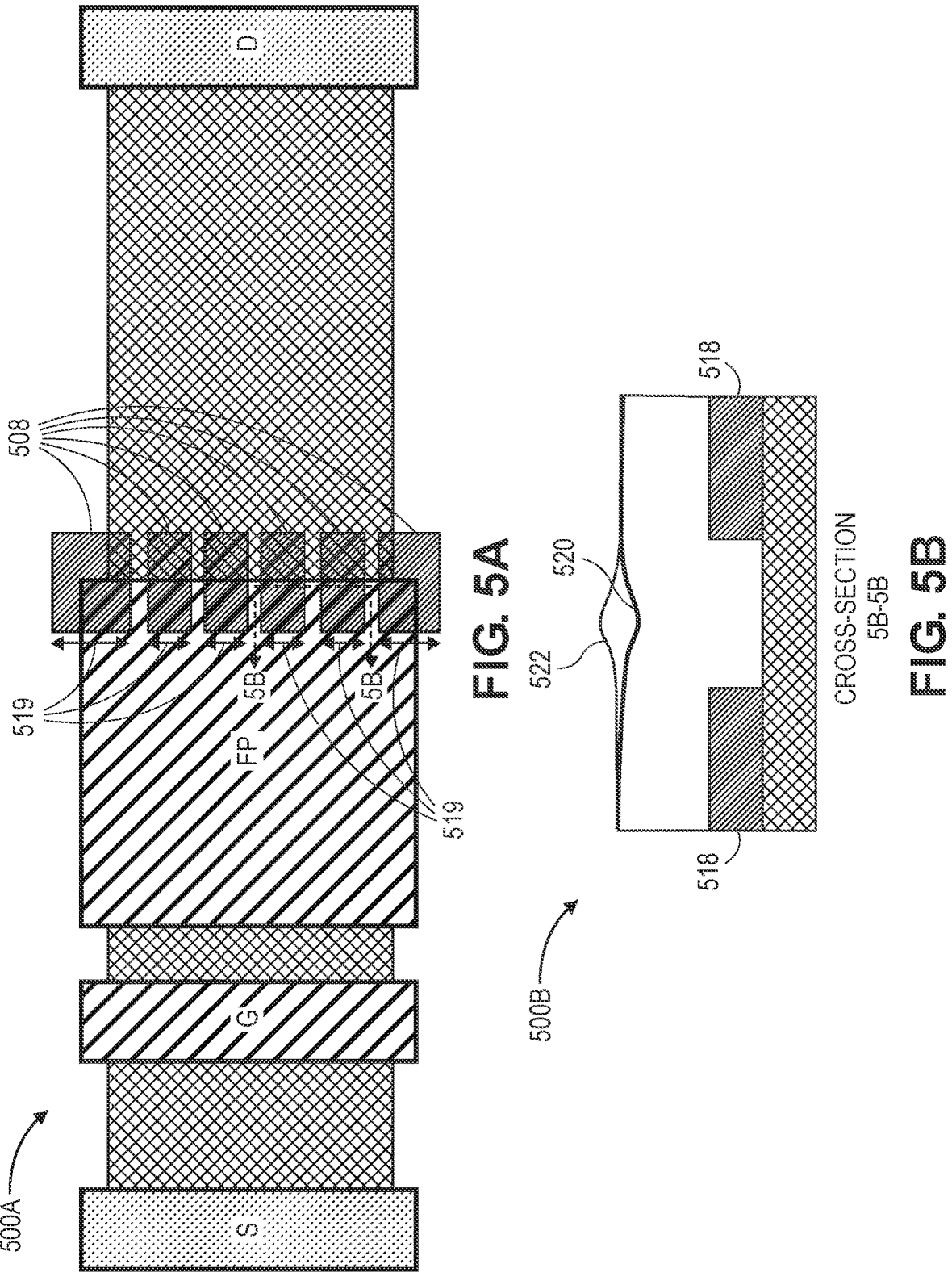
FIG. 5A illustrates a plan view of a GaN transistor with a field plate structure according to an embodiment of the disclosure.
FIG. 5B illustrates a cross-section A-A view of the pedestal islands in FIG. 5A.

FIG. 5A illustrates a plan view of GaN transistor 500A that is similar to transistor 400 illustrated in FIG. 4 according to an embodiment of the disclosure. Transistor 500A is similar to transistor 400, however the pedestals 508 can be in the shape of individual islands. The island configuration may include any feature, aspect, or material previously described, and may be included in any transistor structure discussed above. More specifically, any pedestal structure described above can be solid as shown in FIG. 4 or broken into islands as shown in FIG. 5A. The island widths 519 can vary from, for example, 0.1 um to 1.0 um. The spacing between individual islands can also vary. As appreciated by one of ordinary skill in the art having the benefit of this disclosure, the width of and the spacing between the pedestal islands can be set to any suitable value to adjust the strength of the electric field, as described in more detail below. Further, as appreciated by one of ordinary skill in the art, disclosed field plate structures can have fewer or greater number of pedestals, different sizes for pedestals and other characteristics that can be deferred than those described here.

FIG. 5B illustrates a cross-section 5BA-5B view 500B of the pedestal islands of 500A. As shown in FIG. 5B, as the spacing between the pedestal islands 518 is increased, an indented dielectric layer 520 can be formed. As the spacing between the pedestal islands is decreased, a protruded dielectric layer 522 may be formed, due to, for example, deposition fabrication process. A field plate going over the dielectric layer can follow the contour of the dielectric layer giving it either an indentation or a protrusion, where an indentation can reduce a distance between the field plate and the substrate, and where a protrusion can increase a distance between the field plate and the substrate. This method can be utilized to shape the dielectric layer and to configure the field plate to a desirable shape so as to optimize the electric field and improve the transistor performance. As appreciated by one of ordinary skill in the art having the benefit of this disclosure, the spacing of pedestal islands can be set to any suitable value in order to achieve an optimized shape for the field plate in order to reduce the peak electric field at the edge of the field plate.

Figure 6A:
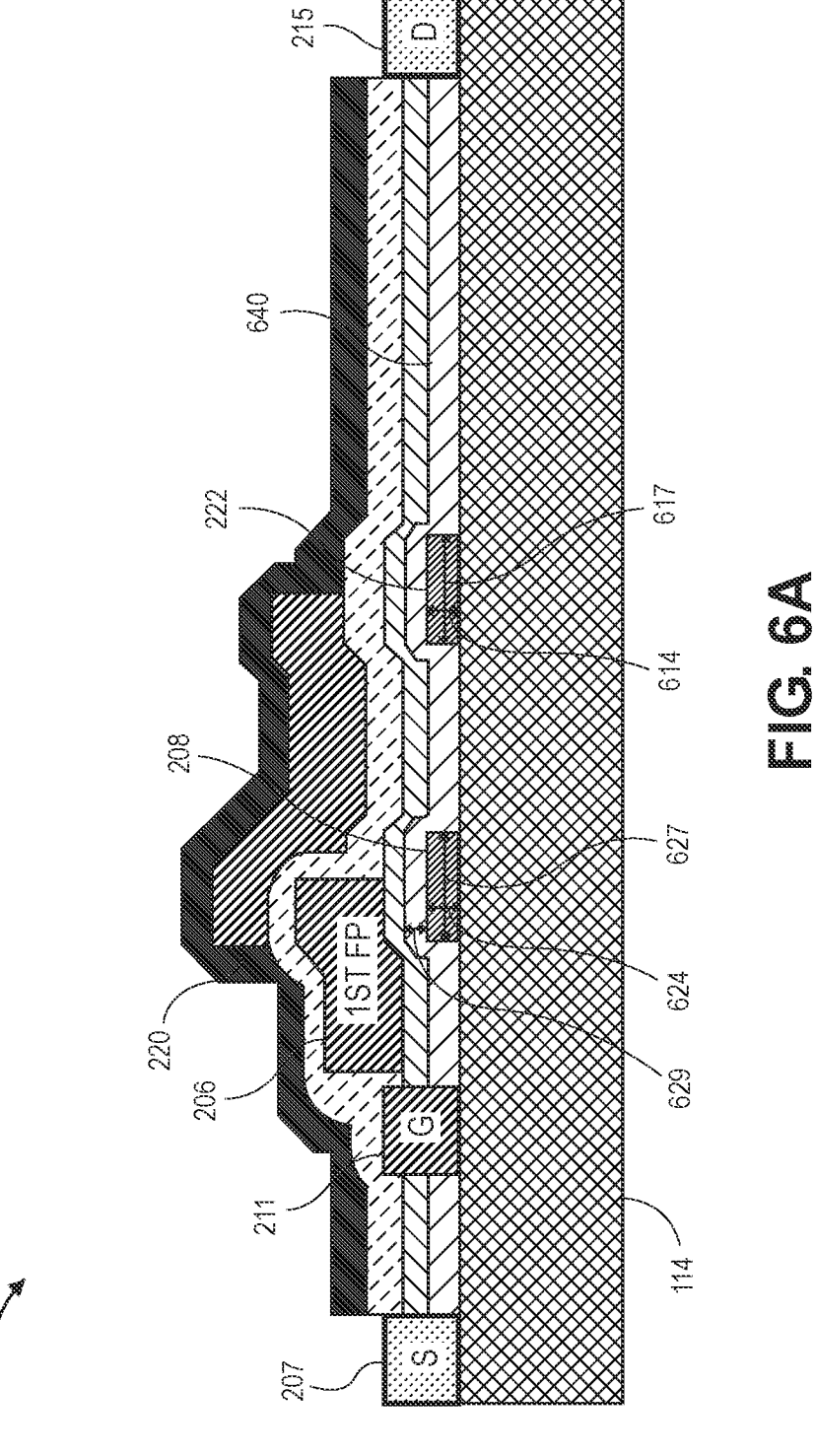
FIG. 6A illustrates a cross-sectional view of a GaN transistor with multiple pedestals and with an additional layer for adjusting the thickness of the pedestals according to an embodiment of the disclosure.

FIG. 6A illustrates a cross-sectional view of an embodiment of a GaN transistor 600A with multiple pedestals and with an additional layer for adjusting the thickness of the pedestals according to an embodiment of the disclosure. GaN transistor 600A is similar to the GaN transistor 200, however GaN transistor 600A can include an additional layer 640 that can be patterned. Layer 640 be formed from, for example (but not limited to), GaN, or AlGaN, or from dielectrics such as silicon nitride or silicon oxide, or from any other suitable material. In various embodiments, layer 640 may be formed, for example, from conductive or non-conductive materials. Layer 640 can be used to control a shape of field plate structures by increasing a thickness of pedestals used in the GaN transistor 600A. Each individual pedestal thickness can be controlled by pattering of the layer 640. GaN transistor 600A can include a first field plate 206 shaped by a pedestal 208 and can include a second plate 220 shaped by a corresponding pedestal 222. GaN transistor 600A can further include a gate 211, a source 207 and a drain 215. GaN transistor 600A can be formed on a substrate 114. In some embodiments, the first field plate 206 can be electrically coupled to gate 211, whereas the second field plate 220 may be electrically coupled to the source 207 of the transistor. First field plate 206 can be connected to the gate 211 to reduce a capacitance between gate 211 and drain 215. In various embodiments, multiple pedestals can be added to multiple field plate structures in lateral high voltage GaN transistors to reduce the electric field resulting in increased reliability, increased operating voltage, and/or reduction in transistor size, as described above.

In some embodiments, pedestals (208 and 222) can be fabricated from, for example (but not limited to) P-type gallium nitride, or from dielectrics such as silicon nitride or silicon oxide, or from any other suitable material. In various embodiments, the pedestals (208 and 222) can be formed, for example, from conductive or non-conductive materials. Width 627 of the pedestal 208 can range between, for example, 1.0 um to 2.0 um. In some embodiments the width of pedestal can be between 0.6 and 0.8 um while in other embodiments the width can be between 0.5 and 1.0 um and in various embodiments the width can be between 0.1 and 5.0 um. Thickness 624 of the pedestal can be, for example, 50 nm to 100 nm. In some embodiments, the thickness can between 60 and 80 nm while in other embodiments the thickness can be between 30 and 200 nm and in various embodiments the thickness can be between 10 and 500 nm. As appreciated by one of ordinary skill in the art having the benefit of this disclosure, the width and thickness of the pedestal can be set to any suitable value. Further, as appreciated by one of ordinary skill in the art, disclosed field plate structures can have fewer or greater number of pedestals, different sizes for pedestals and other characteristics that can be deferred than those described here. Width 617 of the pedestal 222 can range between, for example, 1.0 um to 2.0 um. In some embodiments the width of pedestal can be between 0.6 and 0.8 um while in other embodiments the width can be between 0.5 and 1.0 um and in various embodiments the width can be between 0.1 and 5.0 um. Thickness 614 of the pedestal can be, for example, 50 nm to 100 nm. In some embodiments, the thickness can between 60 and 80 nm while in other embodiments the thickness can be between 30 and 200 nm and in various embodiments the thickness can be between 10 and 500 nm. Thickness 629 of layer 640 can range between, for example, 1.0 um to 2.0 um. In some embodiments the thickness of layer 640 can be between 0.6 and 0.8 um while in other embodiments the thickness can be between 0.5 and 1.0 um and in various embodiments the width can be between 0.1 and 5.0 um. As appreciated by one of ordinary skill in the art having the benefit of this disclosure, the width and thickness of the pedestal can be set to any suitable value. Further, as appreciated by one of ordinary skill in the art, disclosed field plate structures can have fewer or greater number of pedestals, different sizes for pedestals and other characteristics that can be deferred than those described here.

Figures 6B, 6C:
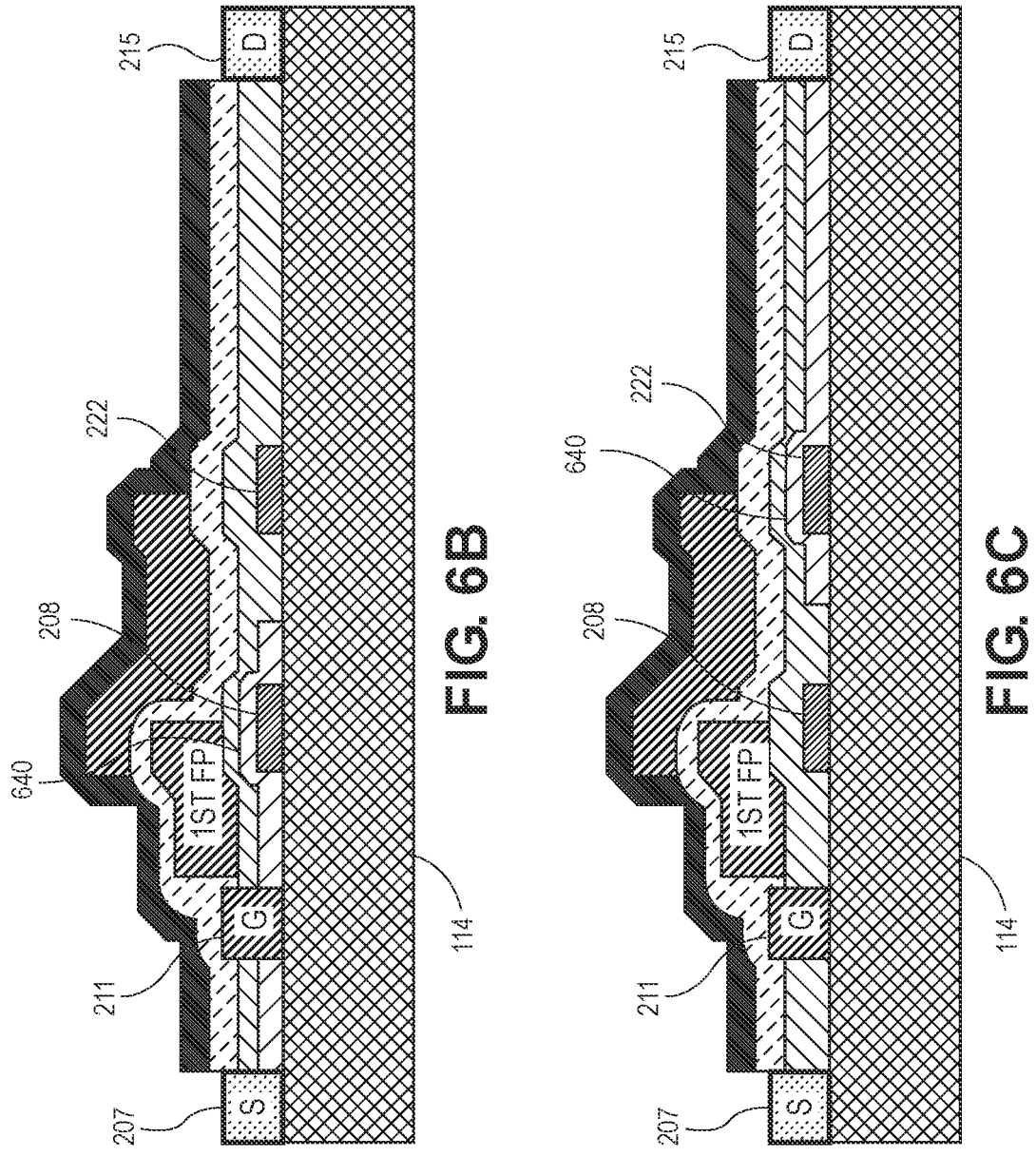
FIGS. 6B-6F illustrate several variations of the GaN transistor of FIG. 6A, where the additional layer may be patterned in various locations according to embodiments of the disclosure.
Figures 6D, 6E:
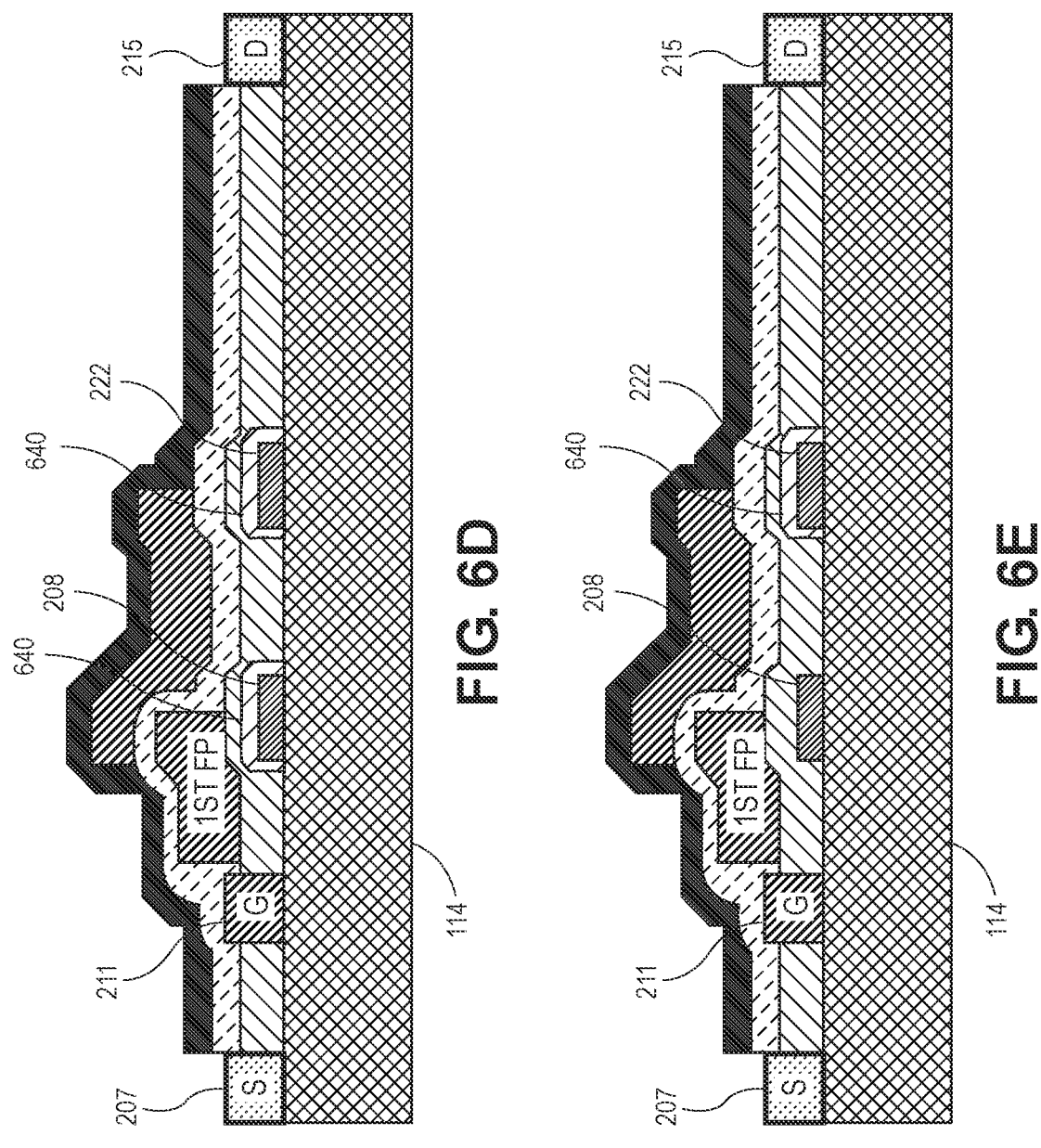
Figure 6F:
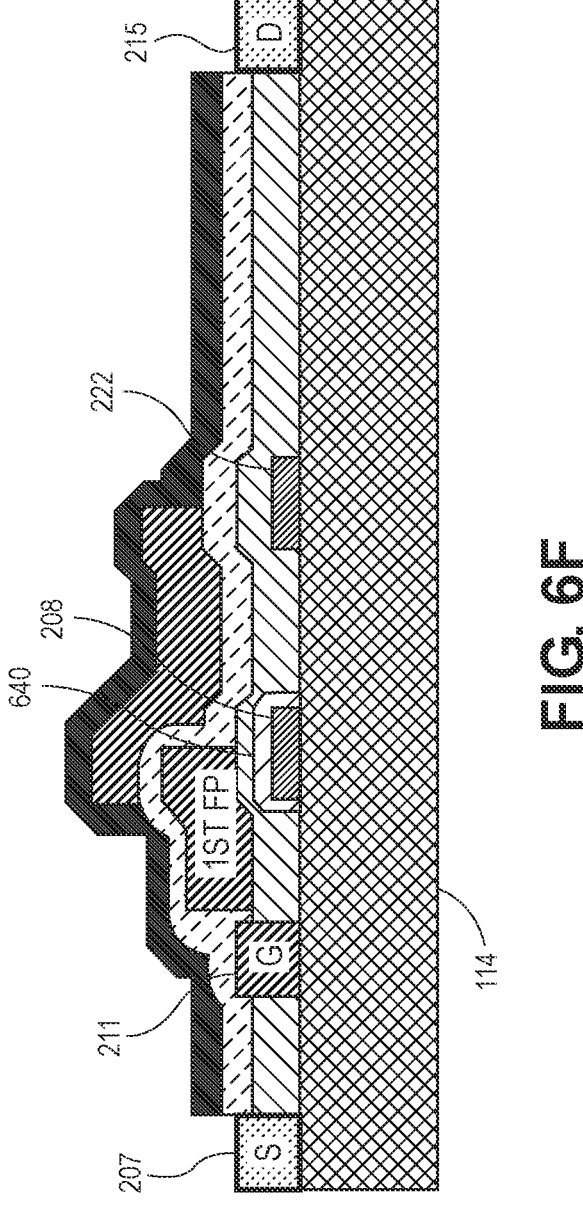

FIGS. 6B-6F illustrate several variations of the GaN transistor 600A, where layer 640 may be patterned in various locations according to embodiments of the disclosure. Layer 640 can be used to control a shape of field plate structures by increasing a thickness of pedestals in the GaN transistor 600A. Each individual pedestal thickness can be controlled by pattering of layer 640. FIG. 6B illustrates an embodiment where layer 640 has been removed from pedestal 222, but remains on pedestal 208. In this way, the thickness of each individual pedestal can be controlled. In FIG. 6B, layer 640 remains in regions proximal to the gate 211 and the source 207. FIG. 6C illustrates an embodiment where layer 640 remains on pedestal 222 and where layer 640 has been removed from pedestal 208. In FIG. 6C, layer 640 remains in regions proximal to the drain. FIG. 6D illustrates an embodiment where layer 640 has been removed in all regions, but remains on pedestals 208 and 222. FIG. 6E illustrates an embodiment where layer 640 has been removed in all regions, but remains on pedestal 222. FIG. 6F illustrates an embodiment where layer 640 has been removed in all regions, but remains on pedestal 208. Other combinations of regions with layer 640 and regions with no layer 640 are possible and are within the scope of this disclosure.

Although field plate structures for GaN transistors (see FIG. 1) are described and illustrated in one particular configuration of a GaN high voltage transistor, embodiments of the disclosure are suitable for use with a other configurations of GaN transistors and non-GaN transistors. For example, any semiconductor device can be used with embodiments of the disclosure. In some instances, embodiments of the disclosure are particularly well suited for use with silicon and other compound semiconductor high voltage transistors.

For simplicity, various internal components, such as the details of the substrate, various dielectric and metal layers, contacts, other components of GaN transistor 100A (see FIG. 1) are not shown in the figures.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

Terms "and," "or," and "an/or," as used herein, may include a variety of meanings that also is expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, B, C, AB, AC, BC, AA, AAB, ABC, AABBCCC, etc.

Reference throughout this specification to "one example," "an example," "certain examples," or "exemplary implementation" means that a particular feature, structure, or characteristic described in connection with the feature and/or example may be included in at least one feature and/or example of claimed subject matter. Thus, the appearances of the phrase "in one example," "an example," "in certain examples," "in certain implementations," or other like phrases in various places throughout this specification are not necessarily all referring to the same feature, example, and/or limitation. Furthermore, the particular features, structures, or characteristics may be combined in one or more examples and/or features.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter. Therefore, it is intended that claimed subject matter not be limited to the particular examples disclosed, but that such claimed subject matter may also include all aspects falling within the scope of appended claims, and equivalents thereof.

What is claimed is:

1. A transistor comprising:
a gallium nitride (GaN) substrate;
a source region formed on the GaN substrate;
a drain region formed on the GaN substrate and separate from the source region;
a gate region formed between the source region and the drain region;
a pedestal formed on the GaN substrate and positioned between the gate region and the drain region, wherein the pedestal is not positioned between the gate region and the source region; and
a field plate electrically coupled to the source region, the field plate extending from a proximal region positioned between the source region and the pedestal, towards the drain region, wherein a starting position of the field plate is disposed between the gate region and the pedestal, and the starting position of the field plate is separated from the GaN substrate by a thickness of a dielectric layer that extends across at least a portion of the GaN substrate and across at least a portion of the pedestal, wherein the dielectric layer is positioned between the pedestal and the field plate, wherein at least a portion of the field plate overlaps at least a portion of the pedestal
wherein a portion of the field plate is formed at an angle with respect to the GaN substrate; and
wherein a value of the angle is determined by a ratio of a distance between a distal region of the field plate and the GaN substrate to a distance between the proximal region of the field plate and the GaN substrate.

2. The transistor of claim 1, wherein the proximal region of the field plate is separated from the GaN substrate by the thickness of the dielectric layer and wherein a distal region of the field plate is separated from the GaN substrate by the thickness of the dielectric layer and the thickness of the pedestal.

3. The transistor of claim 2, wherein a ratio of a distance between the distal region of the field plate and the GaN substrate to a distance between the proximal region of the field plate and the GaN substrate is between 1.05 and 10.0.

4. The transistor of claim 1, wherein the pedestal is a first pedestal of a plurality of pedestals.

5. The transistor of claim 4, wherein each pedestal of the plurality of pedestals is formed in shape of an island.

6. The transistor of claim 1, wherein the pedestal is formed from a P-type GaN layer.

7. The transistor of claim 1, wherein a value of the angle is between 5 to 175 degrees.

8. A transistor comprising:

a gallium nitride (GaN) substrate;

a source region formed on the GaN substrate;

a drain region formed on the GaN substrate and separate from the source region;

a gate region formed between the source region and the drain region;

a pedestal formed on the GaN substrate and positioned between the gate region and the drain region, wherein the pedestal is not positioned between the gate region and the source region and the pedestal is formed from a material that is not doped;

a field plate electrically coupled to the source region, the field plate extending towards the drain region, across a portion of the GaN substrate and across at least a portion of the pedestal; and a dielectric layer extending across at least a portion of the GaN substrate and extending across at least a portion of the pedestal, the dielectric layer being positioned between the pedestal and the field plate, wherein a starting position of the field plate is disposed between the gate region and the pedestal, and the starting position of the field plate is separated from the GaN substrate by a thickness of the dielectric layer;

wherein a portion of the field plate is formed in shape of an angle; and wherein a value of the angle is determined by a ratio of a distance between a distal region of the field plate and the GaN substrate to a distance between a proximal region of the field plate and the GaN substrate.

9. The transistor of claim 8, wherein a proximal region of the field plate is separated from the GaN substrate by the thickness of the dielectric layer and wherein a distal region of the field plate is separated from the GaN substrate by the thickness of the dielectric layer and the thickness of the pedestal.

10. The transistor of claim 9, wherein a ratio of a distance between the distal region of the field plate and the GaN substrate to a distance between the proximal region of the field plate and the substrate is between 1.02 and 10.0.

11. The transistor of claim 8, further comprising two or more pedestals.

12. The transistor of claim 11, wherein the pedestals are formed in shape of islands.

13. A method of forming a transistor, the method comprising:

providing a gallium nitride (GaN) substrate;

forming a source region formed on the GaN substrate;

forming a drain region formed on the GaN substrate and separate from the source region;

forming a gate region formed between the source region and the drain region;

forming a pedestal formed on the GaN substrate and positioned between the gate region and the drain region, wherein the pedestal is not positioned between the gate region and the source region; and forming a field plate electrically coupled to the source region, the field plate extending from a proximal region positioned between the source region and the pedestal, towards the drain region, wherein a starting position of the field plate is disposed between the gate region and the pedestal and the starting position of the field plate is separated from the GaN substrate by a thickness of a dielectric layer that extends across at least a portion of the GaN substrate and across at least a portion of the pedestal, wherein the dielectric layer is positioned between the pedestal and the field plate, wherein at least a portion of the field plate overlaps at least a portion of the pedestal;

wherein a portion of the field plate is formed at an angle with respect to the GaN substrate; and wherein a value of the angle is determined by a ratio of a distance between a distal region of the field plate and the GaN substrate to a distance between the proximal region of the field plate and the GaN substrate.

* * * * *